United States Patent [19]
Rocci, Jr.
[11] 3,984,765
[45] Oct. 5, 1976

[54] POWER OUTLET CIRCUIT TESTER WITH GROUND FAULT TESTING CAPABILITY

[76] Inventor: Joseph A. Rocci, Jr., 12243 S. 71st Ave., Palos Heights, Ill. 60463

[22] Filed: Sept. 27, 1974

[21] Appl. No.: 510,061

[52] U.S. Cl. .................................... 324/51
[51] Int. Cl.[2] .................................... G01R 31/02
[58] Field of Search ................ 324/51, 66; 340/252, 340/255; 339/113 L

[56] References Cited

UNITED STATES PATENTS

| | | | |
|---|---|---|---|
| 2,848,681 | 8/1958 | McKeige et al. | 324/51 |
| 3,205,436 | 9/1965 | Donahue | 324/51 |
| 3,263,164 | 7/1966 | Solgere | 324/51 |
| 3,383,588 | 5/1968 | Stoll et al. | 324/51 |
| 3,668,518 | 6/1972 | Shapiro | 324/66 X |
| 3,718,859 | 2/1973 | Arlow | 324/51 X |
| 3,821,639 | 6/1974 | De Langis | 324/51 |
| 3,836,843 | 9/1974 | Yonce | 324/51 |
| 3,836,844 | 9/1974 | Prugh | 324/51 |
| 3,878,458 | 4/1975 | Muska | 324/51 |
| 3,898,557 | 8/1975 | Strock | 324/51 |
| 3,904,958 | 9/1975 | Gartland et al. | 324/51 |

*Primary Examiner*—Gerard R. Strecker
*Attorney, Agent, or Firm*—Barnes, Kisselle, Raisch & Choate

[57] ABSTRACT

A device for testing electrical continuity at an industrial or household grounded A/C power outlet which is connected to an A/C line voltage through a ground fault circuit breaker. The device includes a housing having at one end thereof an A/C hot, an A/C neutral and a ground prong, and at the other end three lamps electrically connected between corresponding pairs of prongs to provide an indication of the presence or absence of an A/C voltage between the prong pairs when the prongs are received in plug-in connection into the outlet to be tested. The device further includes a momentary switch electrically connected between the A/C hot prong and the ground prong, and which, when activated, provides an overload current leakage path from the A/C line to ground so that the device may be used to check both the electrical continuity at the outlet and the operability of the ground fault circuit breaker in a single step.

8 Claims, 5 Drawing Figures

16 18 24 28 26 24 14 26 20 24 21 12 28 14 22 24 26 40 38 30 32 34 36 58 42 46 56 54 48 52 46 64 50 44 60 62

A/C
A/C

POWER OUTLET CIRCUIT TESTER WITH GROUND FAULT TESTING CAPABILITY

The present invention relates to electrical test equipment and, more particularly, to a device for testing electrical continuity at an industrial or household A/C power outlet.

The National Electric Code (NEC) presently requires that all domestic outdoor A/C power outlets and power outlets at construction sites be "grounded" outlets of the type in which at least one socket receptacle is adapted for connection to A/C ground, the remaining receptacles being adapted for connection to an A/C line voltage. The NEC further requires that each outlet of the type mentioned be connected to the A/C line voltage through a "ground-fault" circuit connection which is responsive to a threshold current differential between the outgoing and return line current to the outlet receptacles, i.e., responsive to a threshold leakage current from one of the A/C receptacles to ground to open the circuit connection between the line voltage and the A/C socket receptacles. It has been proposed that the NEC further require all domestic bathroom and kitchen power outlets be wired to the A/C line voltage through such a ground fault circuit connection. The circuit connection may be provided by a ground fault circuit breaker located at the household junction box, for example. Alternatively, where the household or industrial site has been wired prior to the Code requirement, such circuit breaker may be included in a special ground fault wall outlet which is mounted in place of the usual outlet and which includes a grounded A/C socket and a circuit breaker as an integral unit.

Conventional power outlet circuit test equipment, such as that shown in the patent of Russell F. Stoll et al. U.S. Pat. No. 3,383,588, generally includes a housing having at one end thereof a plurality of prongs suitable for plug-in connection into the outlet to be tested, and at the other end a number of indicating lamps electrically connected between corresponding pairs of prongs. When the circuit tester is plugged into the appropriate receptacle, the lamps selectively light providing an indication of the presence or absence of line voltage between a corresponding prong pair. While such an arrangement is generally satisfactory for testing electrical continuity at the outlet, this device does not provide means for testing the ground fault capability now required by Code as discussed above. It is, therefore, necessary that the building inspector, in addition to using a conventional tester of the type disclosed in the Stoll patent, must make use of some complicated switching and/or metering arrangement to insure that the outlet in question is wired to include this ground fault feature. The complexity of such a testing technique may result in the ground fault test being performed incorrectly, or, worse, not being performed at all.

It is, therefore, an object of the present invention to provide a power outlet circuit tester which will not only check electrical continuity at the outlet in the conventional manner, but which also includes the necessary circuitry for checking the required ground fault capability.

It is another object of the present invention to provide an outlet circuit tester which includes the feature mentioned immediately above and which is, at the same time, economical to manufacture, and easy to transport and operate.

The novel features which are considered characteristic of the present invention are set forth in particular in the appended claims. The invention itself, however, together with additional objects, features and advantages thereof, will be best understood from the following description when read in conjunction with the accompanying drawings in which:

Figures 1, 2, 3, 4, 5:
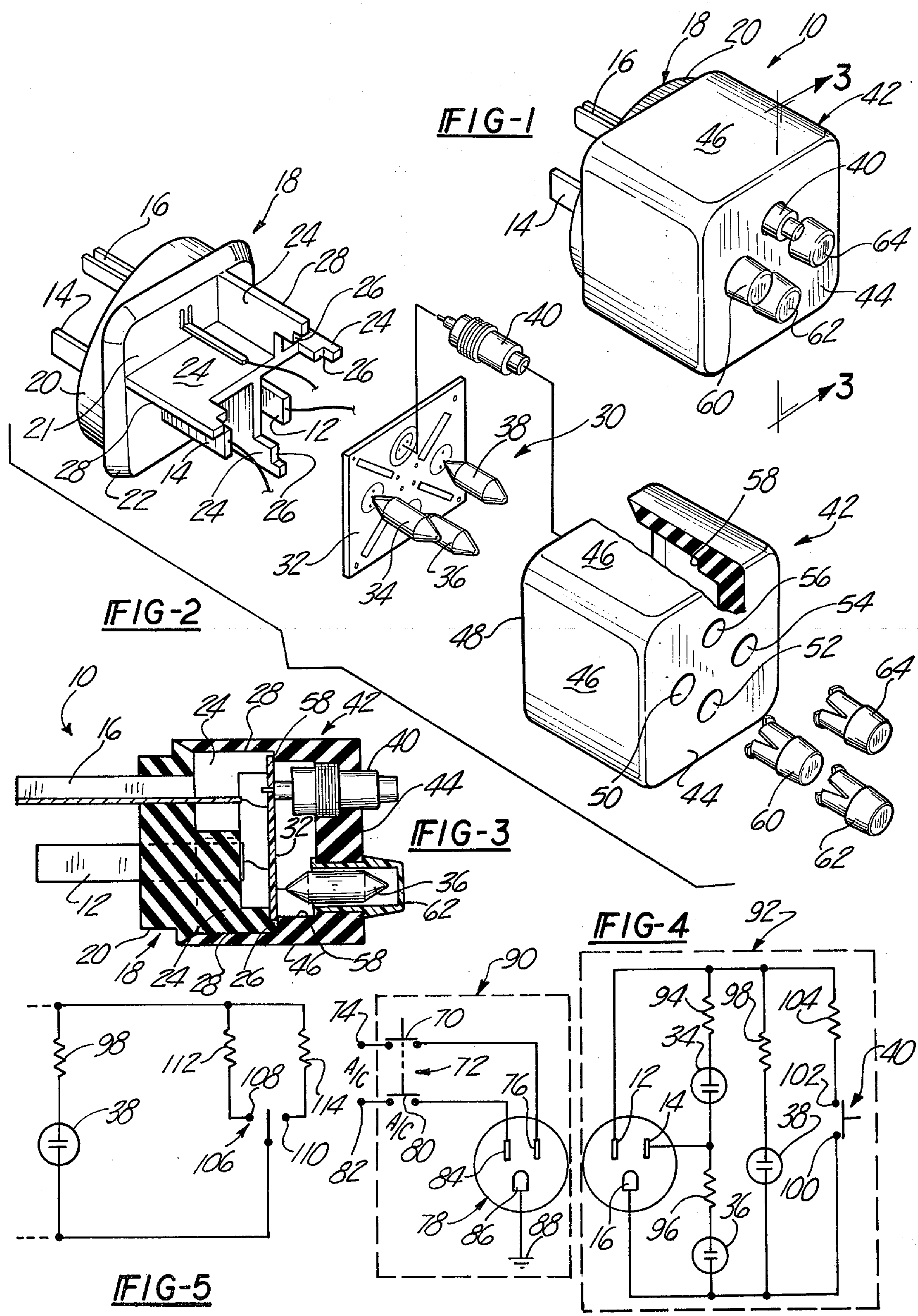
FIG. 1 is a perspective view of the power outlet circuit tester provided by the present invention.
FIG. 2 is an exploded view of the device shown in FIG. 1.
FIG. 3 is a sectional view taken along the line 3—3 of FIG. 1.
FIG. 4 is a schematic diagram of the circuit tester shown in FIGS. 1–3.
FIG. 5 is a schematic diagram of a modification to the device shown schematically in FIG. 4.

Referring to the drawings and particularly to FIGS. 1–3 thereof, the device provided by the present invention includes a housing 10 having mounted at one end thereof an A/C hot prong 12, and A/C neutral prong 14 and a ground prong 16 of the type adapted and configured to be received by plug-in connection into a conventional three-receptacle, single-phase, grounded A/C outlet socket. As best seen in FIG. 2, prongs 12, 14 and 16 are preferably integral with a body 18 of molded plastic. Body 18 includes a generally cylindrical base 20 which encompasses prongs 12, 14 and 16, the upper portion 21 of base 20 extending radially beyond the prongs to terminate in a beveled shoulder 22. Four support legs 24 extend axially upwardly from base 20 (taking base 20 to be at the bottom of housing 10) to terminate in four radially inwardly facing support shoulders 26, the four support shoulders 26 being coplanar with each other on a plane generally parallel to portion 21. Each of the support legs 24 extends generally laterally along base 20 to terminate in a peripheral edge 28 at shoulder 22. The purpose of shoulder 22 and edges 28 will become evident from the discussion to follow.

Mounted on the four support shoulders 26 and electrically connected to prongs 12, 14 and 16 is an electronics assembly 30 which preferably includes a printed circuit board 32 fabricated of copper-clad insulating material according to the usual, well-known photoetching techniques. Mounted on circuit board 32 and extending axially upwardly therefrom are three neon lamps 34, 36 and 38 electrically connected between corresponding pairs of prongs 12, 14 and 16 to provide an indication of the presence or absence of an A/C voltage between the respective prong pairs when the device is plugges into the outlet to be tested. Also mounted on circuit board 32 and extending axially upwardly therefrom in substantially square array with the lamps is a momentary push-buttom switch 40 electrically connected between prongs 12 and 16 to provide, when activated, an overload current leakage path from the A/C line to ground to trip the ground fault circuit breaker discussed above. The circuit connections of lamps 34, 36, 38 and switch 40, as well as the operating details thereof, are discussed hereinafter with reference to FIG. 4. It may be noted at this time, however, that, because the four peripheral edges of circuit board 32 sit squarely upon the four support shoulders 26, circuit board 32 is restrained against any rocking action which would otherwise result should excessive force be used in the activation of switch 40.

A generally cup-shaped cover 42, preferably formed of molded plastic, has a top or end wall 44 and four side walls 46 which are received in press-fit engagement over the peripheral edges 28 of support legs 24. Side walls 46 are connected to form a cup-rim 48 at the lower end of cover 42, which rim seats against shoulder 22 of base 20 when cover 42 is pressed over legs 24 into the closed position. Thus the combination of cover 42 and body 18 forms a compact housing 10 which may be both economically manufactured, and easily stored and transported in the tool box or pocket of an electrical code inspector.

Top wall 44 of cover 42 includes four apertures 50, 52, 54 and 56 which are respectively aligned with lamps 34, 36, 38 and switch 40 such that, when cover 42 is pressed into closed position on base 20, the several lamps and the switch extend upwardly from circuit board 32 through the corresponding apertures. The inner end of aperture 56 is counter sunk, as best seen in FIG. 3, to tightly receive switch 40 and to insure that the switch does not rock on circuit board 32 when pressed by an operator. Cover 42 further includes four shoulders 58 in registry with support shoulders 26, as best seen in FIGS. 2 and 3, to tightly clamp circuit board 32 against shoulders 26 and to thereby enhance the effect of shoulders 26 in preventing rocking movement of the circuit board.

Three snap-in lenses 60, 62 and 64 are respectively received into apertures 50, 52 and 54, tightly fitting over lamps 34, 36 and 38 to protect the lamps from damage during transportation and usage of the test device. Preferably, the several lenses 60, 62 and 64 are variously colored to provide a readily identifiable visual indication of the presence or absence of line voltage between respective pairs of prongs. Alternatively, end wall 44 may be silk-screened or otherwise lettered to identify the respective lamps with a particular prong pair.

As stated above, the embodiment of the present invention shown in FIGS. 1–3 is adapted to test electrical continuity at a three-receptacle, grounded A/C power outlet which is connected to a single-phase line voltage through a ground fault circuit breaker. Thus, referring to FIG. 4, a first pole 70 of a ground fault circuit breaker 72 connects one A/C line terminal 74 to an A/C hot receptacle 76 of a standard outet socket 78. Similarly, a second pole 80 of circuit breaker 72, actuatable in unison with first pole 70, connects a second A/C line terminal 82 to an A/C neutral receptacle 84. Socket 78 also includes a ground receptacle 86 connected to A/C ground 88 and thence, usually, to earth ground as by means of a cold water pipe for example. As stated above, circuit breaker 72 is of the type which is normally closed and which is responsive to a threshold differential between the currents flowing through poles 70 and 80 to open the circuit connections between A/C terminals 74, 82 and socket receptacles 76, 84 respectively. The entire circuit arrangement thus far discussed in connection with FIG. 4, generally indicated at 90, is wired into a house or industrial site and of itself, forms no part of the present invention.

The schematic diagram of the test device provided by the present invention is indicated generally in FIG. 4 at 92. Each neon lamp 34, 36, 38 is connected in series with a current limiting resistor between a selected pair of prongs. Thus, lamp 34 and a resistor 94 are connected between A/C hot prong 12 and neutral prong 14. Similarly, lamp 36 and a resistor 96 are connected between prong 14 and ground prong 16, and lamp 38 is connected with a resistor 98 between prongs 12 and 16. It should be apparent that, when the test device schematically depicted at 92 and so far described is plugged into the outlet to be tested, lamps 34, 36 and 38 will selectively light to provide an indication of the presence or absence of A/C voltage between the respective prong pairs. For example, when the device is plugged into socket 78 which is wired correctly (as shown at 90, FIG. 4, and as described above) and when circuit breaker 72 is closed, an A/C potential will exist across lamps 34 and 38 so that these two lamps will be illuminated. If the A/C hot line is open, however, i.e., if pole 70 is not connected to receptacle 76, no potential will exist across lamp 34 so that the lamp will not be illuminated. Similarly, if the hot and neutral lines are reversed at socket 78, i.e., if pole 70 is connected to receptacle 76, no potential will exist across lamp 34 so that the lamp will not be illuminated. Similarly, if the hot and neutral lines are reversed at socket 78, i.e., if pole 70 is connected to receptacle 84 and pole 72 is connected to receptacle 76, lamps 34 and 36 will be illuminated. It should now be apparent that this arrangement of resistors and lamps thus far described in connection with FIG. 4, which is the same arrangement shown in FIG. 10 of the above-referenced Stoll patent, will test almost every possible configuration of wiring error at socket 78; it should be noted, however, that this arrangement will not provide an indication of a reversal of neutral and ground at socket 78. The improvement provided by the present invention and now to be described not only tests ground fault circuit breaker 72 in the manner generally indicated above, but also tests for the reversal of neutral and ground, thus satisfying what could prove to be a hazardous deficiency in the prior art.

Resistors 94, 96, 98 are chosen to allow an optimim current level through the respective lamps, which level is empirically selected to provide bright illumination and yet allow an extended operating lifetime for each of the lamps. In addition, the value of resistor 98 must be chosen such that the leakage current therethrough from prong 12 to prong 16 is less than the current differential threshold of circuit breaker 72. To momentarily increase this leakage current above the threshold level and to thereby test the operability of circuit breaker 72, switch 40 (FIGS. 1–3) has normally open contacts 100 and 102 which are connected in series with a resistor 104 between prongs 12 and 16 in parallel with resistor 98 and lamp 38. The impedance of resistor 104 is to be chosen such that, when switch 40 is activated, the total current through the two leakage paths, i.e., through resistors 98 and 104, is greater than the differential threshold of circuit breaker 72. If breaker 72 is operating correctly, poles 70 and 72 should then open so that no potential is supplied to socket 78. All of the lamps 34, 36 and 38 will thus be extinguished providing an indication that circuit breaker 72 is open and is, therefore, operating correctly. The operator may then manually reclose breaker 72 so that the test is complete and socket 78 is ready for use.

By way of example and not limitation, circuit breaker 72 may have a differential threshold of 5 milliamperes. Resistor 98, and, for that matter, resistors 94 and 96 may then have a value of 30 KΩ so that the leakage current through resistor 98 and lamp 38 when the socket wiring is correct will be approximately equal to 1.9 milliamps at a line voltage of 115 VAC. If resistor 104 is then chosen to have an impedance of 25 KΩ the total current through leakage resistors 98 and 104 when switch 40 is closed will be approximately equal to 6.5 milliamps which will trip breaker 72. Resistors 94, 96, 98 and 104 may be mounted on circuit board 32 in any convenient arrangement consistant with the circuit connections described.

In explaining the operation of the improvement provided by the present invention it has been assumed that the wiring of socket 78 is correct. Let it now be assumed that the ground and neutral connections at socket 78 are reversed—i.e., that pole 80 is connected to receptacle 86 and that receptacle 84 is connected to ground 88—which wiring error, as explained above, will not be detected by lamps 34, 36 and 38 alone. In this circumstance, a leakage path from A/C to ground will be established through resistor 94 and lamp 34. Therefore, activation of switch 40 will merely provide additional current between A/C hot and neutral and will not open ground fault circuit breaker 72. Lamps 94 and 98 therefore remain lit so that the operator is notified that either the circuit breaker is bad, e.g., that it has a threshold which is too high, or that ground and neutral are reversed at socket 78. Simple investigation will show which of these two possibilities is, in fact, the case.

FIG. 5 shows a simple modification to the preferred embodiment schematically depicted in FIG. 4, which modified embodiment allows testing with a single test unit of two different leakage thresholds. In this modified embodiment switch 40 of FIGS. 1–4 is replaced by a switch 106 having two normally open, momentary-contact terminals 108, 110 connected to prong 12 through resistors 112 and 114 respectively. The common contact of switch 106 is connected to ground prong 16. The impedance value of each of the resistors 112 and 114 is individually chosen in the manner described above with respect to resistor 104 such that two different leakage thresholds are achieved when switch 106 is contacted with contacts 108 and 110.

From the foregoing description it will now be apparent that the power outlet circuit tester with ground fault testing capability provided in accordance with the present invention fully satisfies all of the objects, aims and advantages set forth above. Furthermore, while the invention has been described in detail in connection with a specific embodiment thereof, it will be evident that many alternatives, modifications and variations will suggest themselves to persons skilled in the art in view of the foregoing description. For example, while the invention has been described in detail in connection with a tester for a single-phase, three-receptacle outlet, many other embodiments may be achieved by merely changing the arrangement and number of prongs and lamps, and the number and value of resistors, etc. Accordingly, the present invention is intended to embrace all such alternatives, modifications and variations as fall within the spirit and broad scope of the appended claims.

The invention claimed is:

1. A device for testing electrical continuity at an industrial or household A/C power outlet which includes at least one receptacle adapted for connection to A/C ground, other receptacles in said outlet being electrically connected to A/C line voltage, said device comprising, in combination, a body having a base including a plurality of prongs extending axially of said body and suitable for plug-in connection into said power outlet, one of said prongs being received into said ground receptacle, other of said prongs being received into said other receptacles, said body having a plurality of support legs extending axially upwardly from said base remotely of said prongs, said legs terminating in coplanar support shoulders perpendicular to the body axis, an electronics assembly including a circuit board carried by said support shoulders, at least one lamp electrically connected to a selected pair of said prongs and a switch electrically connected between said one of said prongs and a selected one of said other of said prongs, said lamp and said switch being mounted on and extending axially upwardly from said circuit board, and a cover received over said electronics assembly in coaxial press-fit engagement with said body and including means in registry with said support shoulders to hold said circuit board firmly against said shoulders when said cover is in press-fit engagement with said body, said cover including in its prong-remote end apertures aligned with said at least one lamp and with said switch such that said lamp and said switch extend upwardly into said apertures when said cover is seated in press-fit engagement over said body.

2. The device set forth in claim 1 wherein said base includes a shoulder extending about the periphery thereof, each of said support legs extending generally laterally along said base to terminate in a peripheral edge at said shoulder, and wherein said cover includes side walls and a top wall formed in a generally cupped shape, said side walls of said cover being connected to form a rim at the lower end thereof remote from said top wall and being received in press-fit engagement over said peripheral edges with said rim seated upon said shoulder of said base.

3. The device set forth in claim 1 for use in testing a single-phase, three-receptacle grounded household A/C outlet wherein two of said receptacles are connected to A/C line voltage and a third of said receptacles is connected to ground, and wherein said electronics assembly includes three lamps each electrically connected between a selected pair of said prongs, said lamps and said switch being disposed in substantially square array on said board.

4. The device set forth in claim 1 wherein said at least two other prongs are connectable to said A/C line voltage through ground fault circuit breaker means responsive to a threshold current differential between said at least two other prongs to open the circuit connection between said A/C line voltage and said two other prongs, wherein said electronics assembly includes voltage indicating lamps connected between each selected pair of said at least one prong and said at least two other prongs, and wherein said switch has normally open contacts and impedance means in series connection with said normally open contacts between said at least one prong and said one of said at least two other prongs, said normally open contacts being closeable to provide a current leakage path through said impedance means which, when combined with the leakage path through the one of said voltage indicating lamps connected between said at least one prong and said one of said other two prongs, provides a total leakage current through said device which is greater than said threshold.

5. The device set forth in claim 4 wherein said switch comprises a momentary-contact push button switch.

6. The device set forth in claim 4 wherein said switch comprises a single pole double throw momentary-contact switch, and wherein said impedance means comprises unequal resistors connected in series with respective pairs of normally open switch contacts between said at least one prong and said one of said at least two other prongs, whereby differing leakage current levels are provided depending upon the direction of closure of said switch.

7. The device set forth in claim 1 wherein said circuit board is generally rectangular in peripheral dimension, and wherein said support shoulders and said means in registry therewith are disposed to engage said board about the periphery thereof, each peripheral edge of said board being engaged by at least one said shoulder and means in registry therewith.

8. The device set forth in claim 7 wherein each said shoulder includes a first portion against which said peripheral edge is held by said means in registry with said shoulder, and a second portion disposed radially of said edge and restraining lateral movement of said board.

* * * * *